United States Patent
Di Meo et al.

(10) Patent No.: US 11,497,151 B2
(45) Date of Patent: Nov. 8, 2022

(54) SEALING ARRANGEMENT AND USE THEREOF

(71) Applicant: Carl Freudenberg KG, Weinheim (DE)

(72) Inventors: Herve Di Meo, Sant-Cyr (FR); Marina Nussko, Mannheim (DE); Matthias Hauer, Weinheim (DE); Volker Schroiff, Hemsbach (DE); Marco Sutter, Weinheim (DE)

(73) Assignee: CARL FREUDENBERG KG, Weinheim (DE)

( * ) Notice: Subject to any disclaimer, the term of this patent is extended or adjusted under 35 U.S.C. 154(b) by 128 days.

(21) Appl. No.: 17/195,666

(22) Filed: Mar. 9, 2021

(65) Prior Publication Data

US 2021/0289674 A1    Sep. 16, 2021

(30) Foreign Application Priority Data

Mar. 10, 2020  (DE) ..................... 10 2020 106 470.5

(51) Int. Cl.
*H05K 9/00* (2006.01)
*F16J 15/06* (2006.01)
*F16J 15/12* (2006.01)

(52) U.S. Cl.
CPC .......... *H05K 9/0015* (2013.01); *F16J 15/064* (2013.01); *F16J 15/122* (2013.01)

(58) Field of Classification Search
CPC ............................. F16J 15/064; H05K 9/0015
See application file for complete search history.

(56) References Cited

U.S. PATENT DOCUMENTS

| | | | | |
|---|---|---|---|---|
| 6,696,639 B1* | 2/2004 | Nurmi | ........... | H05K 9/0015 174/363 |
| 9,109,701 B1* | 8/2015 | Copeland | ............ | F16J 15/122 |
| 10,588,248 B1* | 3/2020 | Falslev | ............ | H05K 9/0081 |
| 11,359,722 B2* | 6/2022 | Maheshwari | ......... | F16J 15/008 |
| 2006/0017235 A1* | 1/2006 | Vesa | ............... | H05K 9/0015 361/818 |
| 2006/0220324 A1 | 10/2006 | Anderson | | |

(Continued)

FOREIGN PATENT DOCUMENTS

| | | |
|---|---|---|
| DE | 102010018270 A1 | 12/2010 |
| DE | 102015001122 A1 | 8/2016 |

(Continued)

*Primary Examiner* — Hung V Ngo
(74) *Attorney, Agent, or Firm* — Leydig, Voit & Mayer, Ltd.

(57) ABSTRACT

A sealing arrangement includes: a first machine element and a second machine element, each made of an electrically-conductive material; and a seal. The first and second machine elements are sealed against one another by the seal. At least one of the machine elements is made of an electrically-conductive plastic which is at least partially covered by an electrically-insulating, injection-molded skin as a result of production. The seal has an electrically-conductive support body. The support body has at least one substantially mandrel-shaped projection comprising an electrically-conductive material which is arranged on a side of the support body facing the injection-molded skin and completely penetrates the injection-molded skin.

6 Claims, 2 Drawing Sheets

(56) References Cited

U.S. PATENT DOCUMENTS

| | | | |
|---|---|---|---|
| 2007/0012117 A1* | 1/2007 | Hiroki | F16J 15/064 |
| | | | 73/768 |
| 2008/0042437 A1 | 2/2008 | Athalye | |
| 2008/0130260 A1* | 6/2008 | Kouda | F16J 15/102 |
| | | | 361/818 |
| 2009/0295106 A1 | 12/2009 | Kallhoff | |
| 2010/0276894 A1 | 11/2010 | Jin | |
| 2012/0299249 A1* | 11/2012 | Okamura | F16J 15/064 |
| | | | 277/549 |
| 2014/0203514 A1* | 7/2014 | Colineau | F16J 15/064 |
| | | | 277/549 |
| 2016/0327222 A1 | 11/2016 | Rudisill | |
| 2018/0023705 A1* | 1/2018 | Watanabe | F16J 15/064 |
| | | | 277/647 |
| 2018/0112779 A1 | 4/2018 | Nahrwold | |
| 2018/0328490 A1* | 11/2018 | Claus | F16J 15/064 |
| 2021/0262569 A1* | 8/2021 | Bond | F16J 15/121 |

FOREIGN PATENT DOCUMENTS

| | | |
|---|---|---|
| DE | 102016221611 A1 | 5/2018 |
| EP | 3312480 A1 | 4/2018 |
| JP | 2001284872 A | 10/2001 |
| JP | 2017038027 A | 2/2017 |

\* cited by examiner

SEALING ARRANGEMENT AND USE THEREOF

CROSS-REFERENCE TO PRIOR APPLICATION

Priority is claimed to German Patent Application No. DE 10 2020 106 470.5, filed on Mar. 10, 2020, the entire disclosure of which is hereby incorporated by reference herein.

FIELD

The invention relates to a sealing arrangement and to the use thereof, wherein the sealing arrangement comprises a first and a second machine element, each consisting of an electrically-conductive material, and a seal, wherein the two machine elements are sealed against one another by the seal.

BACKGROUND

Such a sealing arrangement is generally known. For example, the two machine elements can be formed by two housing parts of a multi-part housing which encloses an electrical component.

An electrically-conductive sealing arrangement which is used in hybrid and electric vehicles is known from DE 10 2010 018 270 A1. The electrically-conductive sealing arrangement is intended to prevent dispersed RF energy from leading to undesired interferences, e.g., to interferences in the vehicle electronics and/or to impairments of the radio reception. These undesired interferences are to be prevented in that a seal used in the sealing arrangement consists of an electrically-conductive material and is arranged in an electrically-conductive manner between a shaft to be sealed and a housing.

SUMMARY

In an embodiment, the present invention provides a sealing arrangement, comprising: a first machine element and a second machine element, each comprising an electrically-conductive material; and a seal, wherein the first and second machine elements are sealed against one another by the seal, wherein at least one of the machine elements comprises an electrically-conductive plastic which is at least partially covered by an electrically-insulating, injection-molded skin as a result of production, wherein the seal comprises an electrically-conductive support body, and wherein the support body comprises at least one substantially mandrel-shaped projection comprising an electrically-conductive material which is arranged on a side of the support body facing the injection-molded skin and completely penetrates the injection-molded skin.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
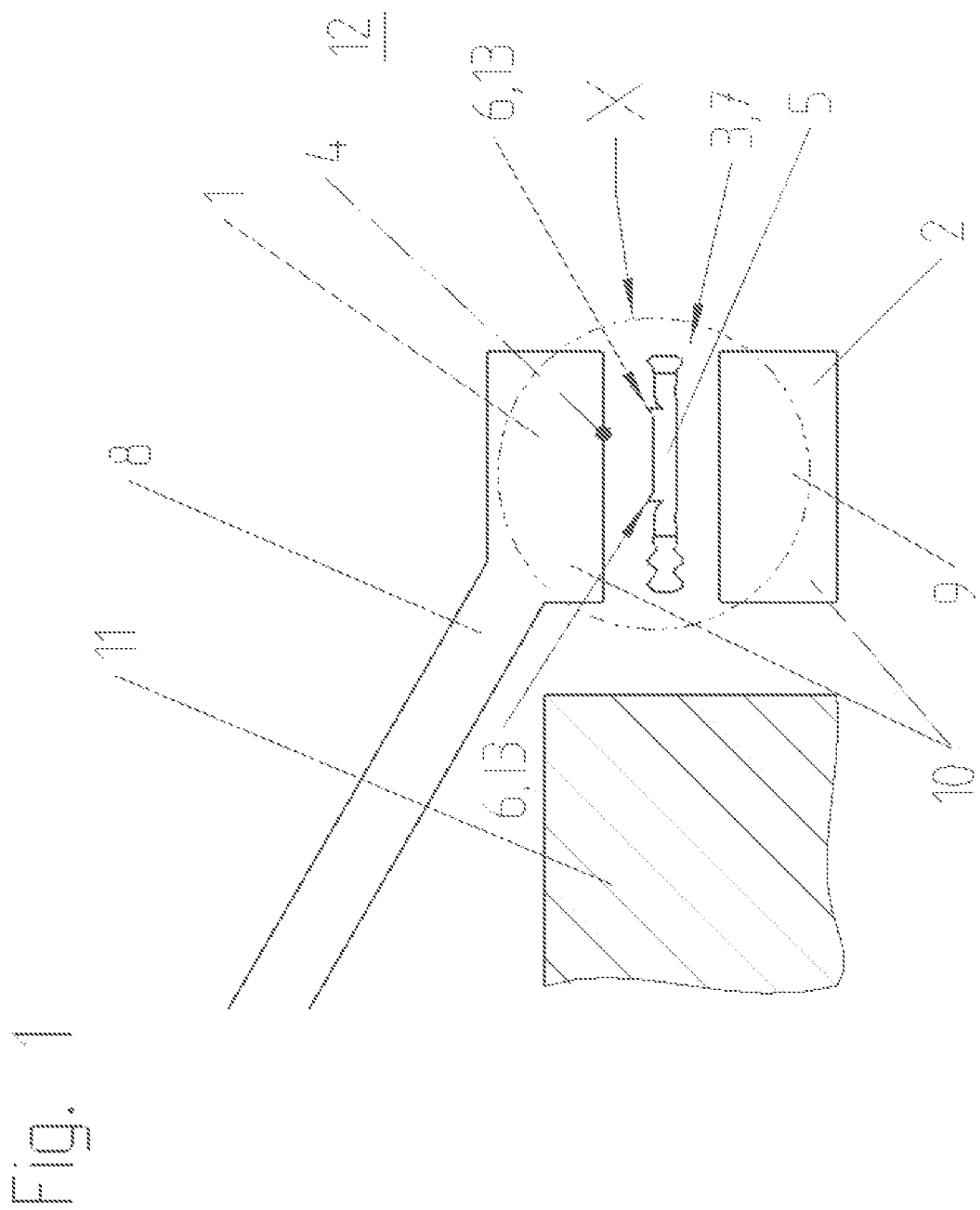
FIG. 1 is a section from the sealing arrangement—for better understanding, in an exploded view.

In an embodiment, the present invention provides a sealing arrangement of the type mentioned at the outset in such a way that it has further functions in addition to its sealing function and can thereby be used to particular advantageous in the field of "e-mobility." In particular, electromagnetic interference waves shall be able to be effectively shielded by the sealing arrangement even when at least one of the machine elements is made of a plastic.

A use of such a sealing arrangement is also to be mentioned.

This aim is achieved according to the invention by a sealing arrangement as described herein and a use as described herein. The present description also discusses advantageous embodiments of the sealing arrangement.

To achieve the aim, it is provided that at least one of the machine elements consist of an electrically-conductive plastic which is at least partially covered by an electrically-insulating, injection-molded skin as a result of production, that the seal comprise an electrically-conductive support body, and that the support body comprise at least one, substantially mandrel-shaped projection made of an electrically-conductive material which is arranged on the side of the support body facing the injection-molded skin and completely penetrates the injection-molded skin.

Usually, the two electrically-conductive machine elements each consist of a metallic material. Machine elements made of metallic materials frequently have a significantly higher weight in comparison to corresponding machine elements made of plastic. Lightweight construction is becoming increasingly important, in particular, for mobile uses, and thus, for example, in motor vehicles, with regard to protecting the environment by reducing the consumption of raw materials and energy.

If the sealing arrangement is used in connection with "e-mobility," and the two machine elements are part of a housing in which an electrical component is arranged, the interior of the housing and the surroundings must be electromagnetically shielded from one another in order to minimize interfering mutual influences from the interior of the housing to the surroundings and from the surroundings to the interior of the housing. However, machine elements exclusively made of metallic materials have hitherto been used for electromagnetic shielding because they are reliably electrically conductive.

Plastic parts have hitherto not been used for shielding of electromagnetic interference waves. This is presumably due to the fact that plastics have, due to their production, an injection-molded skin which is electrically insulating. The injection-molded skin is also electrically insulating if the plastic of which the machine element consists is electrically conductive—for example, as a result of the fact that electrically-conductive particles are arranged in the plastic.

In order to be able to use an electrically-conductive plastic for at least one of the machine elements, however, it is necessary for the electrically-insulating, injection-molded skin to be completely penetrated to make electrical contact.

According to the invention, it is provided that the seal comprise an electrically-conductive support body and that the support body comprise a substantially mandrel-shaped projection made of an electrically-conductive material which is arranged on the side of the support body facing the injection-molded skin and completely penetrates the injection-molded skin.

For good electromagnetic shielding, it is necessary for the two machine elements used to be reliably connected to one another in an electrically-conductive manner by the seal. The electrically-conductive connection takes place through the electrically-conductive projection of the electrically-conductive support body.

In the context of the present invention, a substantially mandrel-shaped projection is understood in the broadest sense to mean a geometry that penetrates the electrically-insulating, injection-molded skin, i.e., for example, also cutting shaped elements, such as a cutting edge, which is arranged on the support body.

The cutting edge is preferably arranged to run circumferentially on the support body. This achieves a particularly reliable electrically-conductive connection between the machine elements.

Because the machine elements are connected to one another in an electrically-conductive manner by the seal, electromagnetic interference waves are prevented from escaping from the housing into the surroundings and interfering with the functioning of electronic components arranged in the surroundings. And/or interference waves from the surroundings are prevented from entering the housing from the surroundings and interfering with the functioning of electrical components arranged inside the housing.

In an advantageous embodiment, it can be provided that the support body and the projection transition into one another in one piece and be formed of a uniform material. Such an embodiment makes it possible to produce the seal simply and cost-effectively. It is also advantageous that the sealing arrangement overall has a structure with a small number of parts and that the risk of errors during assembly of the sealing arrangement is reduced to a minimum as a result.

The support body and the projection can consist of a metallic material. Support bodies made of metallic materials can also be produced simply and cost-effectively in large quantities.

The seal can be designed as a flat seal. Such flat seals are usually used to seal flanges of housing parts in multi-part housings against one another.

As already explained above, the at least one machine element can be formed by a housing part of a housing.

Both machine elements can also be designed as housing parts, form the housing, and each consist of an electrically-conductive plastic. In such a case, the support body would have at least one, substantially mandrel-shaped projection on each of its sides facing away from one another, which projection completely penetrates the injection-molded skin of the respective machine element in order to connect the machine elements to one another in an electrically-conductive manner.

The use of the sealing arrangement is particularly advantageous when the two machine elements form housing parts of a housing and enclose, in an electromagnetically-shielding manner, an electrical component emitting electromagnetic interference waves. The electrical component can be formed, for example, by an electric motor of a motor vehicle. The sealing arrangement prevents electromagnetic interference waves from escaping from the inside of the housing into the surroundings and there interfering with other electrical components. For example, control devices or the radio in a motor vehicle.

FIG. 1 shows a section from the sealing arrangement according to the invention in a schematic representation. The region X is shown in the form of an exploded view in order to be able to better recognize the individual parts of the sealing arrangement and their details.

FIG. 1 shows the sealing arrangement, which comprises the housing 10 for an electrical component 11—here, an electric motor—that emits electromagnetic interference waves. The two machine elements 1, 2 form the two housing parts 8, 9 of the housing 10.

The first 1 and the second machine element 2 each consist of an electrically-conductive material. Either both machine elements 1 and 2 consist of an electrically-conductive plastic, or only one of the machine elements 1 or 2.

The two machine elements 1, 2 are sealed against one another and are connected to one another in an electrically-conductive manner by the seal 3. The electrical component 11 is electromagnetically shielded from the surroundings 12 by the two machine elements 1, 2 and the seal 3.

In the exemplary embodiment shown, the first machine element 1 consists of an electrically-conductive plastic, whereas the second machine element 2 consists of a metallic material. The first machine element 1 is covered by an electrically-insulating, injection-molded skin 4 as a result of production. This electrically-insulating, injection-molded skin 4 must be penetrated in order to connect the two machine elements 1, 2 in an electrically-conductive manner by means of the seal 3. As a result, the electromagnetic interference waves caused by the electrical component 11 during its intended use are electromagnetically shielded from the surroundings 12.

The seal 3 is specially designed for this purpose. The seal 3 comprises an electrically-conductive support body 5 made of a metallic material, wherein the support body 5 in the exemplary embodiment shown here has a substantially mandrel-shaped projection 6 in the form of a cutting edge which extends so as to run circumferentially along the support body 5. In the exemplary embodiment shown, the support body 5 and the mandrel-shaped projection 6 consist of an electrically-conductive plate. The mandrel-shaped projection 6 completely penetrates the injection-molded skin 4 during the intended use of the sealing arrangement. Because the projection 6 completely penetrates the injection-molded skin 4, the support body 5 and the projection 6 connect the first machine element 1 consisting of an electrically-conductive plastic to the second machine element 2 consisting of a metallic material in an electrically-conductive manner.

The support body 5 and the projection 6 transition into one another in one piece and are formed of a uniform material.

In the exemplary embodiment shown, the seal 3 is designed as a flat seal 7. The opposing flanges of the two machine parts 1, 2 are sealed against one another by the flat seal 7.

Figure 2:
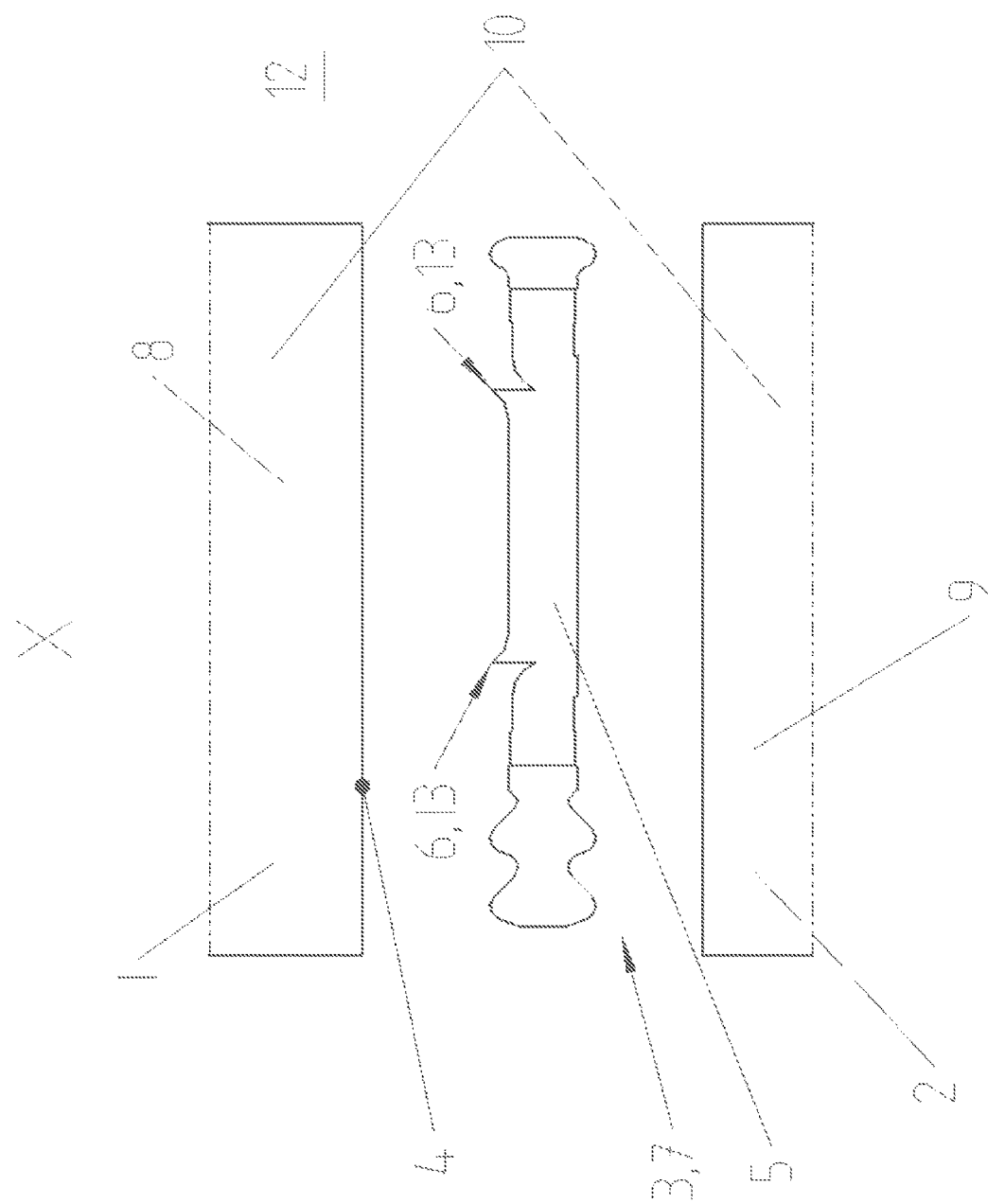
FIG. 2 is an enlarged section X from FIG. 1.

FIG. 2 shows the section X from FIG. 1 in an enlarged view. As described above, the seal 3 comprises the electrically-conductive support body 5 and the projection 6 projecting in the direction of the first machine element 1, which projection is designed here as circumferential cutting edge 13. The injection-molded skin 4, which is always created in the case of a plastic part as a result of production and is electrically insulating, is completely penetrated by the cutting edge 13.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A sealing arrangement, comprising:
    a first machine element and a second machine element, each comprising an electrically-conductive material; and
    a seal,
    wherein the first and second machine elements are sealed against one another by the seal,
    wherein at least one of the machine elements comprises an electrically-conductive plastic which is at least partially covered by an electrically-insulating, injection-molded skin as a result of production,
    wherein the seal comprises an electrically-conductive support body, and
    wherein the support body comprises at least one substantially mandrel-shaped projection comprising an electrically-conductive material which is arranged on a side of the support body facing the injection-molded skin and completely penetrates the injection-molded skin.

2. The sealing arrangement according to claim 1, wherein the support body and the projection transition into one another in one piece and comprise a uniform material.

3. The sealing arrangement according to claim 1, wherein the support body and the projection comprise a metallic material.

4. The sealing arrangement according to claim 1, wherein the seal comprises a flat seal.

5. The sealing arrangement according to claim 1, wherein the at least one machine element comprises a housing part of a housing.

6. A method, comprising:
    using the sealing arrangement according to claim 1,
    wherein the first and second machine elements form housing parts of a housing and enclose, in an electromagnetically-shielding manner, an electrical component emitting electromagnetic interference waves.

* * * * *